United States Patent
Ohta et al.

(10) Patent No.: US 7,598,584 B2
(45) Date of Patent: Oct. 6, 2009

(54) INFRARED SOLID-STATE IMAGE PICKUP APPARATUS AND A PRODUCTION METHOD THEREOF

(75) Inventors: Yasuaki Ohta, Tokyo (JP); Masashi Ueno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 379 days.

(21) Appl. No.: 11/330,259

(22) Filed: Jan. 12, 2006

(65) Prior Publication Data

US 2006/0157812 A1 Jul. 20, 2006

(30) Foreign Application Priority Data

Jan. 14, 2005 (JP) ............................. 2005-007977

(51) Int. Cl.
*H01L 31/058* (2006.01)
(52) U.S. Cl. .................. 257/470; 257/355; 257/347; 257/354; 257/374; 257/E29.287; 257/184; 257/187; 257/292
(58) Field of Classification Search .................. 257/470, 257/355, 354, E29.287, 184, 187, 292
See application file for complete search history.

(56) References Cited

U.S. PATENT DOCUMENTS

| | | | |
|---|---|---|---|
| 4,998,155 A | | 3/1991 | Watanabe et al. |
| 5,640,013 A | * | 6/1997 | Ishikawa et al. ......... 250/338.4 |
| 6,459,101 B1 | * | 10/2002 | Fujishima et al. ........... 257/133 |
| 6,504,153 B1 | | 1/2003 | Shigenaka et al. |
| 6,573,504 B2 | * | 6/2003 | Iida et al. .................. 250/338.4 |
| 2001/0025926 A1 | | 10/2001 | Mashio et al. |
| 2001/0028035 A1 | | 10/2001 | Iida et al. |

FOREIGN PATENT DOCUMENTS

| | | |
|---|---|---|
| EP | 0 911 881 A2 | 4/1999 |
| JP | 7-162024 | 6/1995 |
| JP | 2001-44400 | 2/2001 |
| JP | 2001-267542 | 9/2001 |
| JP | 2002-148111 | 5/2002 |

OTHER PUBLICATIONS

Masashi Ueno, et al. "Monolithic Uncooled Infrared Image Sensor with 160×120 Pixels", Proc. SPIE, 1995, vol. 2552, pp. 636-643.
Masashi Ueno, et al. "320×420 Element Uncooled Infrared Focal Plane Array Using SOI Wafer", ITE Technical Report, vol. 24, No. 17, pp. 53-58, IPU2000-16(Feb. 2000).

* cited by examiner

*Primary Examiner*—Wael Fahmy
*Assistant Examiner*—Marc Armand
(74) *Attorney, Agent, or Firm*—Oblon, Spivak, McClelland, Maier & Neustadt, L.L.P.

(57) ABSTRACT

An infrared solid-state image pickup apparatus includes an SOI substrate having a silicon oxide film layer and an SOI layer on a silicon substrate, a detecting portion which is provided with a PN junction diode formed on the SOI substrate and converts a temperature change generated by an incident infrared ray to an electric signal, and a support that holds the detecting portion with a space from the silicon substrate of the SOI substrate. An impurity in a semiconductor layer constituting the PN junction diode is distributed such that carriers flowing in the semiconductor layer are distributed in such an uneven manner as being much in a central portion of the semiconductor layer than in a peripheral portion thereof.

9 Claims, 16 Drawing Sheets

INFRARED SOLID-STATE IMAGE PICKUP APPARATUS AND A PRODUCTION METHOD THEREOF

BACKGROUND OF THE INVENTION

1. Field of the Invention

The present invention relates to an infrared solid-state image pickup apparatus provided with a semiconductor device such as a diode as a thermosensitive device and a production method thereof.

2. Description of the Related Art

In a conventional infrared solid-state image pickup apparatus, image information has been obtained by using a PN junction diode formed in a silicon layer as a thermosensitive device and using an output signal of the PN junction diode. Further, an impurity distribution inside a P type semiconductor layer of the PN junction diode and an impurity distribution inside an N type semiconductor layer have each been performed in an even manner (for example, refer to M. Ueno et al., "Non-Cooling Infrared Image Sensor Having 320×240 Pixels using SOI substrate", Technical Report at Video Information Media Symposium, Vol. 24, No. 17, pp. 53 to 58 (Feb. 25, 2000)).

In a PN junction diode in a conventional infrared solid-state image pickup apparatus, a semiconductor layer of the PN junction diode has been encompassed by a separation oxide film therearound for device separation, an insulating film thereon for protection of the PN junction diode and the like. In an interface between these separation oxide film and the like and the semiconductor layer of the PN junction diode, an interface trap is present and, then, electrically conductive carriers are generate-recombined, to thereby generate a noise. For this account, there has been a problem in that an SN ratio of an output of the PN junction diode, consequently, an SN ratio of an output of the infrared solid-state image pickup apparatus is decreased.

SUMMARY OF THE INVENTION

The present invention provides an infrared solid-state image pickup apparatus having a favorable SN ratio of an output.

According to an aspect of the present invention, an infrared solid-state image pickup apparatus includes an SOI substrate having a silicon oxide film layer and an SOI layer on a silicon substrate, a detecting portion which is provided with a PN junction diode formed on the SOI substrate and converts a temperature change generated by an incident infrared ray to an electric signal, and a support that holds the detecting portion with a space from the silicon substrate of the SOI substrate. An impurity in a semiconductor layer constituting the PN junction diode is distributed such that carriers flowing in the semiconductor layer are distributed in such an uneven manner as being much in a central portion of the semiconductor layer than in a peripheral portion thereof.

According to another aspect of the present invention, a method for producing an infrared solid-state image pickup apparatus includes the steps of forming a PN junction diode by injecting an impurity into an SOI layer of an SOI substrate including a silicon oxide layer and the SOI layer on a silicon substrate, constituting a detecting portion for converting a temperature change generated by an incident infrared ray to an electric signal, providing etching holes around the detecting portion, and a support joined with the detecting portion, forming a cavity inside the silicon substrate by introducing an etchant from the etching hole, and constructing a concentration distribution of an impurity in the step of injecting the impurity such that carriers flowing in the semiconductor layer constituting the PN junction diode are allowed to be distributed much in a central portion than in a peripheral portion of the semiconductor layer.

According to the present invention, since the concentration distribution of the impurity is set such that the carriers flowing in the PN junction diode which detects an incident infrared ray are unevenly distributed much in the central portion than in the peripheral portion, a noise in the PN junction diode is reduced. For this account, the SN ratio of the output of the PN junction diode is enhanced and, consequently, an infrared image pickup apparatus having a favorable SN ratio of output can be obtained.

DETAILED DESCRIPTION OF THE INVENTION

Embodiment 1

An infrared solid-state image pickup apparatus according to Embodiment 1 of the present invention is a non-cooling type (referred to also as "thermal type") infrared solid-state image pickup apparatus. Particularly, an example shown in Embodiment 1 is such that an infrared solid-state image pickup apparatus is formed by using a substrate denoted as an SOI (silicon on insulator) substrate. Further, in the SOI substrate, an SOI layer (silicon on insulator, namely, silicon single crystal layer) is formed on a silicon substrate via a silicon oxide film denoted as a buried oxide film (hereinafter, referred to also as "BOX layer"). In an ordinary semiconductor industry, a high-frequency transistor or the like is built in this SOI layer. In Embodiment 1 according to the invention, a PN junction diode for detecting an infrared ray is built in this SOI layer. Further, in order to effectively convert the infrared ray incident in the infrared solid-state image pickup apparatus into a temperature change of the PN junction diode, the detecting portion containing the PN junction diode is held in the midair apart from the silicon substrate by an elongated support (hereinafter, referred to also as "supporting leg") For this account, since the detecting portion is thermally insulated from the silicon substrate, the incident infrared ray can efficiently be converted into a temperature change, to thereby enhance an output change of the PN junction diode.

Hereinafter, the infrared solid-state image pickup apparatus 100 in Embodiment 1 according to the invention is now described in detail with reference to the accompanying drawings.

Figure 1:
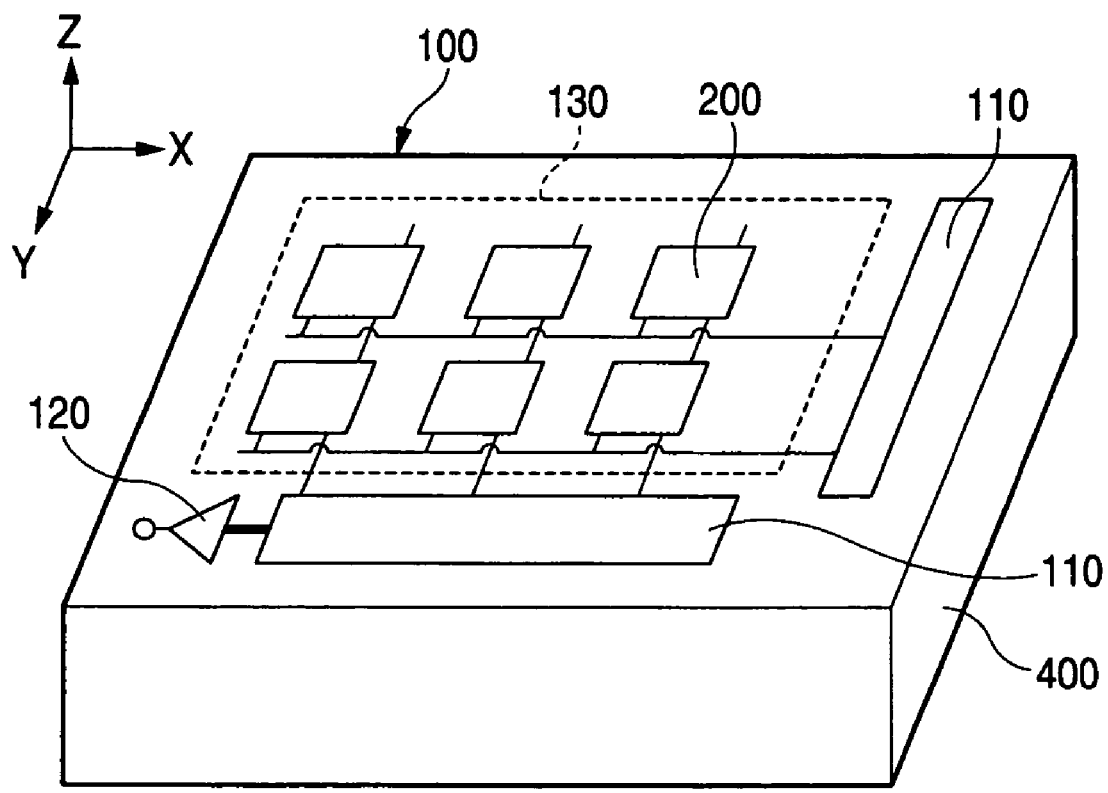
FIG. 1 is a perspective view of an infrared solid-state image pickup apparatus showing Embodiment 1 according to the present invention.

FIG. 1 is a perspective diagram showing an infrared solid-state image pickup apparatus 100 in Embodiment 1 of the invention. In FIG. 1, a plurality of detectors 200 are arranged in an array on an SOI substrate 400. A scanning circuit 110 for addressing each of the thus-arranged detectors and a signal processing circuit 120 for treating a signal outputted by the detector 200 and, then, outputting the thus-treated signal outside are provided in the peripheral portion of the detector array 130.

Figure 2:
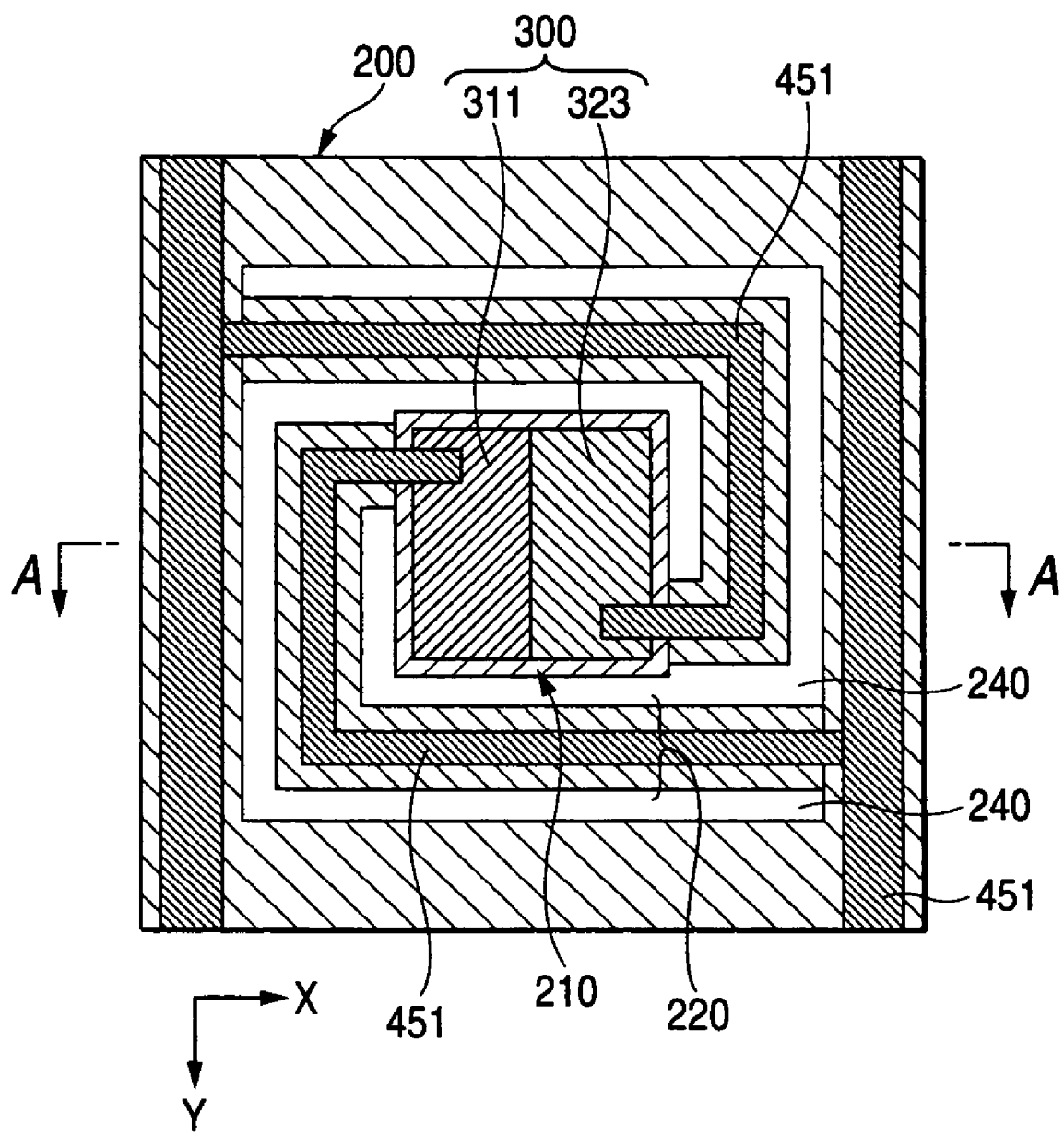
FIG. 2 is a plan view showing a detector in Embodiment 1 according to the present invention.

FIG. 2 is a partially enlarged plan view of the detector 200 shown in FIG. 1 and is a partially perspective view according to a PN junction diode 300 for facilitating an explanation. The detector 200 is constituted by a detecting portion 210 and a supporting leg 220. In the detecting portion 210, the PN junction diode is housed. Further, the detecting portion 210 is connected to a substrate side by the supporting leg 220 and is electrically connected to the scanning circuit 110 as shown in FIG. 1 via a wiring 451 arranged in the supporting is leg 220.

Figure 3:
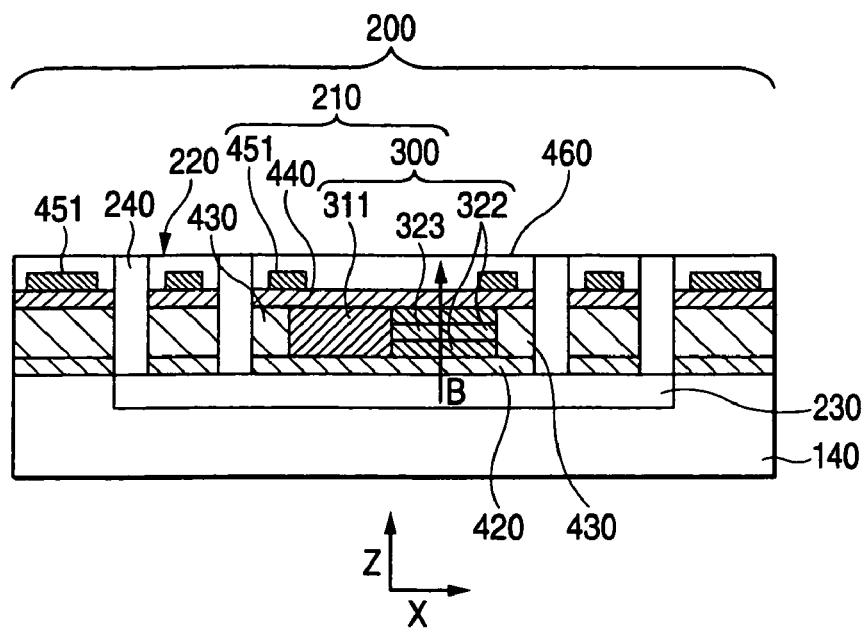
FIG. 3 is a cross-sectional view showing a detector in Embodiment 1 according to the present invention.

FIG. 3 is a cross-sectional diagram taken along line A-A in FIG. 2 and shows a state in which the detector 200 has an insulation structure. The detecting portion 210 is held by a supporting leg 220 on a cavity 230 generated by removing a portion of the silicon substrate 140. For this account, the detecting portion 210 is constituted in such a manner as is thermally insulated from the silicon substrate 140.

The PN junction diode 300 is constituted by a P type semiconductor layer and an N type semiconductor layer. Semiconductor layers are classified in accordance with differences in impurity concentrations and are denoted as, for example, an $N^+$ type, an $N^-$ type, an $N^{--}$ type, a $P^+$ type, a $P^-$ type, and a $P^{--}$ type. Namely, the impurity concentration becomes lower in order, from a "+" type to a "--" type.

The PN junction diode 300 in Embodiment 1 as shown in FIG. 3 is an example showing a $P^+$ $N^-$ junction diode. Namely, a P type semiconductor layer 311 is a $P^+$ type of high concentration and the N type semiconductor layer is constituted such that it is separated into an $N^-$ type semiconductor layer 322 and an $N^{--}$ type semiconductor layer 323 which is lower in concentration than the $N^-$ type semiconductor layer 322. The N type semiconductor layer as shown in Embodiment 1 is constituted by a 3-layer structure made up of the $N^-$ type semiconductor layer 322, the $N^{--}$ type semiconductor layer 323 and the $N^-$ type semiconductor layer 322. Further, an underlayer of the P type semiconductor layer and the N type semiconductor layer is a BOX layer 420, while an upper layer thereof is an insulating film 440 containing a silicon oxide film. Still further, a side face of each of the P type and N type semiconductor layers comes in contact with a separation oxide film 430. Namely, the semiconductor layer of the PN junction diode 300 comes in contact with the silicon oxide film in all peripheries thereof.

Figure 4:
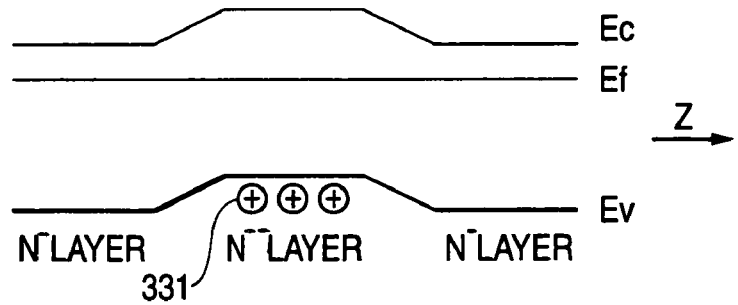
FIG. 4 is an energy level diagram of an N type semiconductor layer in Embodiment 1 according to the present invention.

FIG. 4 is a diagram showing an energy level observed from a direction along an arrow-marked B line shown in FIG. 3. In FIG. 4, the N type semiconductor layer is constituted by a 3-layer constitution made up of the $N^-$ type semiconductor layer 322, the $N^{--}$ type semiconductor layer 323 and the $N^-$ type semiconductor layer 322. In a diagram showing an energy level, a conductive band and a valence band in the region of the $N^{--}$ type semiconductor layer 323 are higher than those in the region of the $N^-$ type semiconductor layer 322. Further, in FIG. 4, a bottom of the conductive band is denoted as Ec, an apex of the valence band is denoted as Ev and a Fermi level is denoted as Ef. When a forward bias is applied to the PN junction diode, holes 331 which are excessive minority carriers are flowed from the P type semiconductor layer to the N type semiconductor layer.

On this occasion, the holes are major carriers in the P type semiconductor layer; however, those flowed into the N type semiconductor layer by the bias are ordinarily called as the excessive minority carriers. For the purpose of facilitating explanation of the carriers which contribute to electric conductivity flowing in the PN junction diode, these carriers are simply called as "carriers" in the explanation described below.

Figure 5:
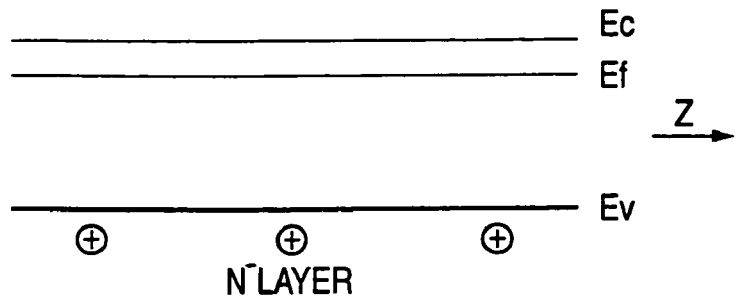
FIG. 5 is an energy level diagram in an N type semiconductor layer having a conventional structure.

FIG. 5 is an energy level diagram in the PN junction diode of a conventional structure. Namely, FIG. 5 is an example of the energy level of the N type semiconductor layer observed from the $N^-$ type semiconductor layer 322. In the conventional PN junction diode, as shown in FIG. 5, the impurity concentration distribution of the $N^-$ type semiconductor layer 322 is uniform, the valence band is flat and the holes 331 are distributed in all areas of the $N^-$ type semiconductor layer 322.

Next, a cause of generation of noise is described and, then, a measure for resolution in Embodiment 1 is explained.

Firstly, a noise in the PN junction diode is examined.

As for noises which the PN junction diode generates, three causes are considered as follows:

(1) thermal noise;
(2) shot noise; and
(3) 1/f noise.

The thermal noise is generated by a thermal effect of the carrier; a shot noise is generated by implanting the carrier into the semiconductor layer via a depleted layer in an irregular manner; and the 1/f noise is generated by two causes: one of them is fluctuation of mobility of the carrier and the other is fluctuation of density of the carrier. Further, since the 1/f noise becomes large in a low frequency region, for example, for a solid-state image pickup apparatus which takes up an image at a 30 Hz cycle, flickering on a screen becomes one factor for deteriorating an image quality. In Embodiment 1, the reason for forming such a structure as allows the 1/f noise to be lower is to contribute to enhancing the image quality of the solid-state image pickup apparatus.

Next, in a practical diode structure, a cause for generating the 1/f noise is explained. In FIGS. 2 and 3, more trap levels are present in the vicinity of an interface between a P type semiconductor layer or an N type semiconductor layer and each of an insulating film 440 and a BOX layer 420 which interpose the P type semiconductor layer or the N type semiconductor layer constituting the PN junction diode 300 therebetween (hereinafter, referred to simply as "interface of semiconductor/oxide film"), or in the vicinity of an interface between the P type semiconductor layer or the N type semiconductor layer and a separation oxide film 430 which encompasses the periphery of the P semiconductor layer or the N semiconductor layer than in the central portion of the P semiconductor layer or the N semiconductor layer (hereinafter, referred to simply as "semiconductor layer").

In the $P^+ N^-$ junction diode having the conventional structure, as shown in FIG. 5, since the impurity of the $N^-$ type semiconductor layer 322 was evenly distributed, the valence band was flat. For this account, the carriers have been captured by the trap levels which were present at the interface of the semiconductor/oxide film, to thereby cause the 1/f noise to be generated.

Next, a device for reducing the 1/f noise according to Embodiment 1 of the invention is described. In FIG. 4, the holes 331 of the carriers gather at a place in which a potential energy is highest, namely, at an apex of the valence band. That is, they gather not in the $N^-$ type semiconductor layer 322 but in the $N^{--}$ type semiconductor layer 323. In other words, the holes 331 gather none of at the interface between the $N^-$ type semiconductor layer 322 and the insulating film 440, and in the vicinity of the interface between the $N^-$ type semiconductor layer 322 and the BOX layer 420, but in the central portion of the $N^{--}$ type semiconductor layer 323. For this account, the carriers come to be less captured by the trap levels of the interface of semiconductor/oxide film; the 1/f noise can be suppressed.

Figure 6A:
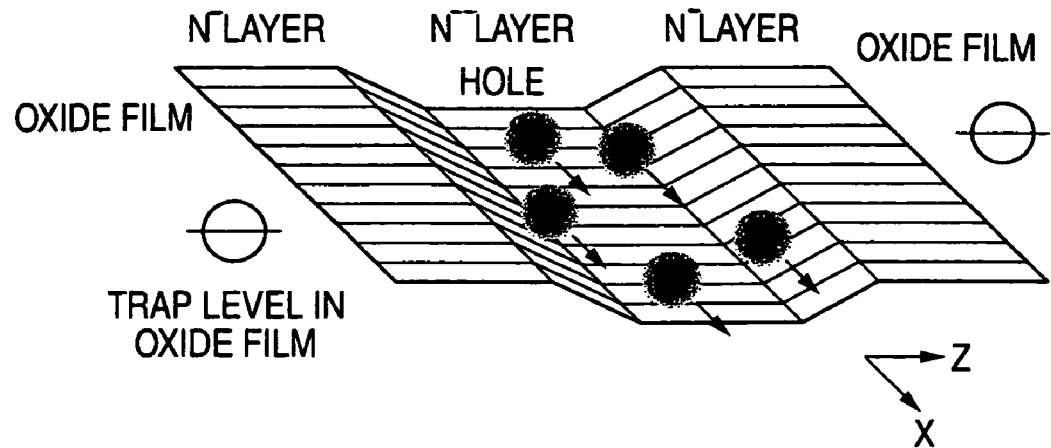
FIGS. 6A and 6B are each a diagram explaining behaviors of carriers in an N type semiconductor layer in Embodiment 1 according to the present invention.
Figure 6B:
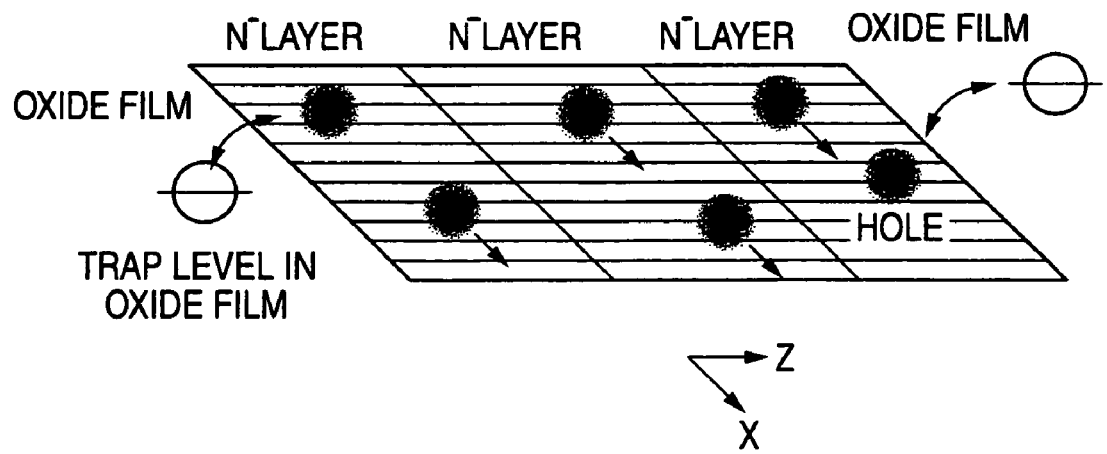

Now, a reason for reducing the noise of the PN junction diode 300 is described. A constant current source is contained in a scanning circuit 110 of Embodiment 1 and, then, a forward current is flowed in the PN junction diode 300. A change of an incident infrared ray is converted into a temperature change of the detecting portion 210 and, then, appears in the form of a change of a forward bias of the PN junction diode 300. FIG. 6 schematically shows a manner in which the holes 331 of the carriers flow in the N type semiconductor layer. FIG. 6A shows an example of a structure of Embodiment 1, in which, since the potential energy flows while gathering at the apex of the valence band, the carriers are less captured by the trap levels which are present at the interface of the semiconductor/oxide film. FIG. 6B shows an example of a conventional structure, in which the carriers are captured by the trap levels. As described above, generation-recombination of the carriers at an interface between the semiconductor layer and the surrounding semiconductor/oxide film is reduced than in a conventional case and, then, since a fluctuation of the carrier density becomes small, fluctuation of the forward current flowing in the PN junction diode 300 becomes small. Namely, the noise of the PN junction diode 300 becomes small.

Next, behaviors of the infrared solid-state image pickup apparatus 100 are described. When the infrared ray emitted from a subject which is an object to be subjected to an image pickup in the infrared solid-state image pickup apparatus 100 is incident on a detector 200 in a detector array 130, a temperature of a detecting portion 210 is raised. At this time, electric characters of the PN junction diode 300 are changed in accordance with temperature changes. Subsequently, the scanning circuit 110 reads out the temperature changes every detector 200 in order and, then, signals thus read out are outputted outside via a signal treatment circuit 120. By the signals outputted outside, a thermal image of the subject can be obtained.

Characteristics attributable to a structure of the detector 200 of Embodiment 1 are described. In the detector 200 of the Embodiment 1, the detecting portion 210 is connected to the silicon substrate 140 via the supporting leg 220. Since thermal conductance of the supporting leg 220 is set to be small, a temperature change of the detecting portion 210 becomes large and, then, thermal sensitivity of the detector 200 can be high. Namely, in each detector 200, since heat is hard to be escaped to a silicon substrate 140 due to an insulating structure by the supporting leg 220, the infrared ray can efficiently be converted into a temperature changed portion, to thereby prepare a detector structure of high sensitivity.

Figure 7A:
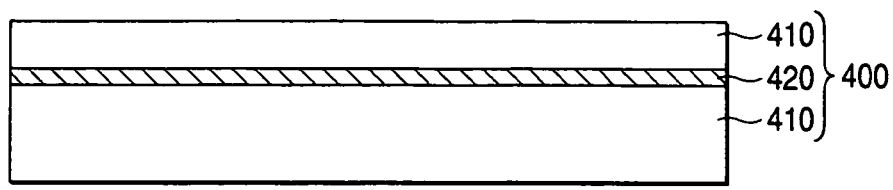
FIGS. 7A to 7E are cross-sectional diagrams showing a production method of an infrared solid-state image pickup apparatus of Embodiment 1 according to the present invention.
Figure 7B:
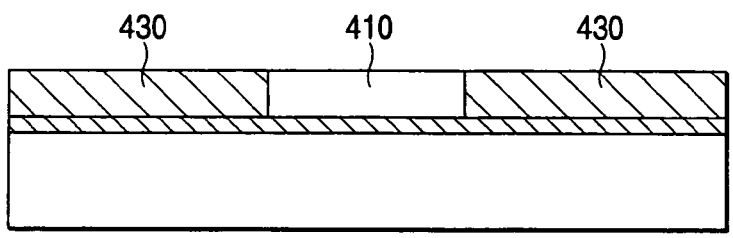
Figure 7C:
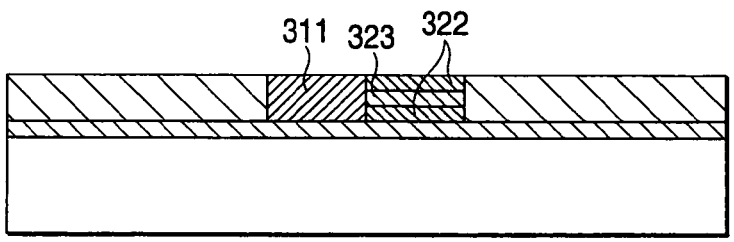
Figure 7D:
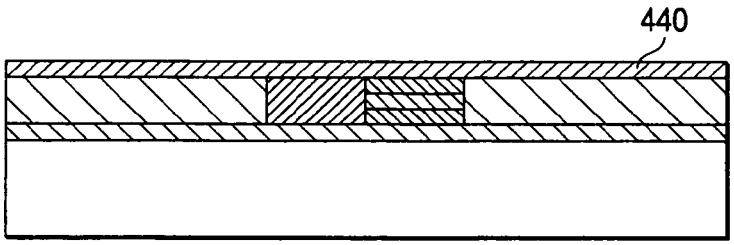
Figure 7E:
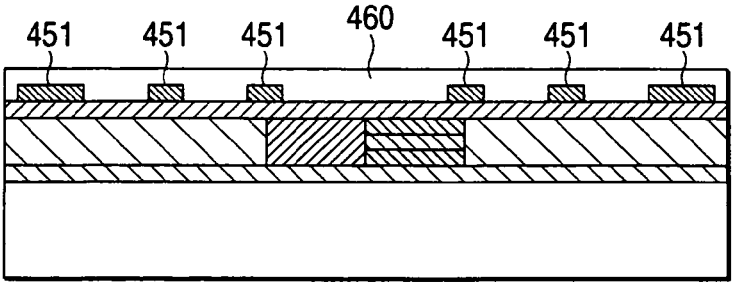
Figure 8F:
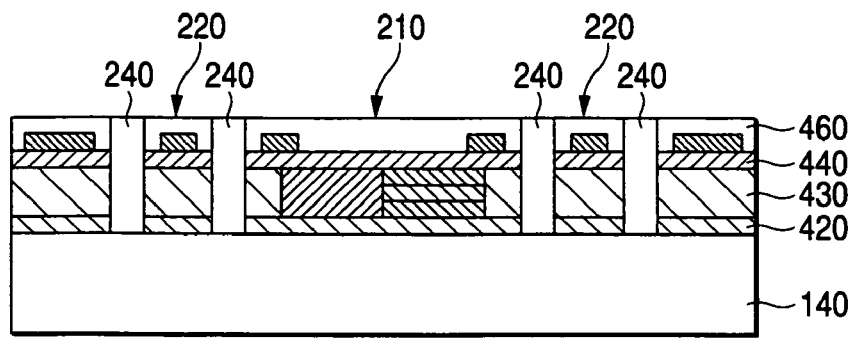
FIGS. 8F and 8G are cross-sectional diagrams showing a production method of an infrared solid-state image pickup apparatus of Embodiment 1 according to the present invention.

Next, a method for producing the infrared solid-state image pickup apparatus 100 in Embodiment 1 is described. FIGS. 7 and 8 each show a cross-sectional structure of one detector 200 of the infrared solid-state image pickup apparatus 100 and show the manner in which the detector 200 is fabricated in order of production steps. In FIG. 7A, firstly, a so-called SOI substrate 400 in which a BOX layer 420 and an SOI layer 410 are laminated in a stated order on the silicon substrate 140 as a substrate is prepared. Subsequently, by an LOCOS (local oxidation of silicon) separation method or a trench separation method, a separation oxide film 430 is formed on a predetermined position for the purpose of a device separation. In FIG. 7B, the separation oxide film 430 is formed in other portions than the PN junction diode 300 of the detector 200. Then, as shown in FIG. 7C, phosphorus and arsenic are ion-implanted in the region of the SOI layer 410 forming the N type semiconductor layer of the PN junction diode 300, to thereby form the $N^{--}$ type semiconductor layer 323 and the $N^-$ type semiconductor layer 322. In a same manner as described above, in order to form the P type semiconductor layer of the PN junction diode 300, boron is ion-implanted in the SOI layer 410, to thereby form the $P^+$ type semiconductor layer 311. When the $N^{--}$ type or $N^-$ type semiconductor layer is formed, an accelerating potential and an amount of implantation at the time of the ion-implantation are adjusted such that the N type semiconductor layer has a 3-layer structure. FIG. 7C shows a semiconductor layer portion of the PN junction diode 300 formed in such manner as described above. Next, as shown in FIG. 7D, an insulating film 440 (for example, a silicon oxide layer deposited by a CVD method) is deposited thereon. Next, as shown in FIG. 7E, a metallic film such as an aluminum film is deposited thereon, to thereby form a wiring 451. Subsequently, as a protective film 460 for protecting the wiring 451 and the PN junction diode 300, for example, a silicon oxide film is further deposited thereon.

Although not shown in FIG. 7, a diode, a transistor, an electric capacitance and the like which constitute the signal treatment circuit 120 as shown in FIG. 1 and the like are formed through the above-described ion-implanting step, film forming step and the like.

Figure 8G:
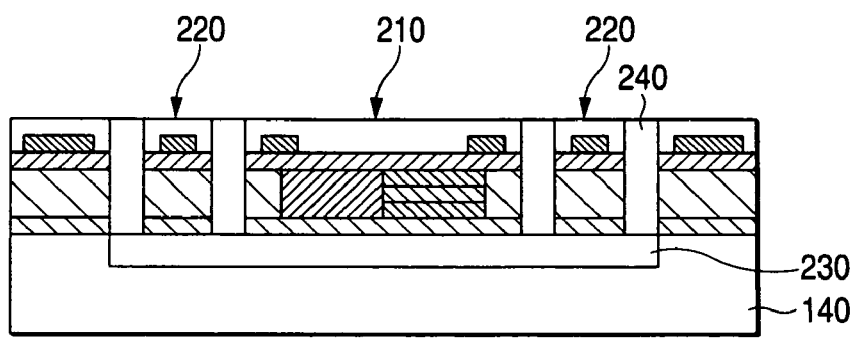

Subsequently, a step of forming a cavity 230 in an lower portion of the detector 200 is described with reference to FIG. 8. Firstly, an etching hole 240 is provided at a predetermined position of the detector 200. FIG. 8 shows a state in which the etching hole 240 is provided. Other portions than the portion in which the etching hole 240 is not provided constitutes the supporting leg 220 and the detecting portion 210. The etching hole 240 is a hole which, piercing through a protective film 460 and the insulating film 440 and the BOX layer 420 that are provided under the protective film 460, reaches the silicon substrate 140. In the last, an etchant such as xenon fluoride is introduced through the thus-provided etching hole 240, the silicon substrate 140 is etched and, then, the cavity 230 is formed inside the silicon substrate 140. FIG. 8G shows a final state of the production steps. The detecting portion 210 is supported by the supporting leg 220 such that the detecting portion 210 is held in the air. In such a manner as described above, the infrared solid-state image pickup apparatus 100 provided with the detector 200 is completed.

As described above, in the infrared solid-state image pickup apparatus 100 according to Embodiment 1, since the noise of the PN junction diode 300 is reduced more than that of the conventional one and the SN ratio of the output of the PN junction diode 300 is enhanced, the infrared solid-state image pickup apparatus 100 having a favorable SN ratio of the output of the PN junction diode 300 can be provided.

In Embodiment 1, an example of the $P^+ N^-$ junction diode was shown; however, even when an impurity concentration of the semiconductor layer is changed into another mode, the same noise reduction effect as described above can be obtained. Namely, even when the N type semiconductor layer is set to be the $N^+$ type of high concentration and, then, the P type semiconductor layer is divided such that it comes to have a 3-layer structure made up of the $P^-$ type semiconductor layer 312, the $P^{--}$ type semiconductor layer 313 and the $P^-$ type semiconductor layer 312 in accordance with differences of concentrations, the same effect as described above can be obtained. That is, this PN junction diode 300 is the $P^-N^+$ junction diode and may be arranged such that electrons become excess minority carriers in the region of the $P^-$ type semiconductor layer 312.

Embodiment 2

Hereinafter, the infrared solid-state image pickup apparatus 100 in Embodiment 2 according to the invention is now described in detail with reference to the accompanying drawings.

In Embodiment 1, an example of a mode in which the N type semiconductor layer among the P type and N type semiconductor layers was constituted in a 3-layer structure was shown. In Embodiment 2, an example of a mode in which, in addition to the N type semiconductor layer, the P type semiconductor layer is also constituted in a 3-layer structure is shown. The portion in which the infrared solid-state image pickup apparatus 100 in Embodiment 2 is different from that in Embodiment 1 is only the portion of a $P^+ N^-$ junction diode and a mechanical structure of the detector 200, the signal treatment circuit 120, movement and the like are same as in Embodiment 1. Hereinafter, the portion of the PN junction diode which is a major portion of Embodiment 2 is described in detail.

Figure 9:
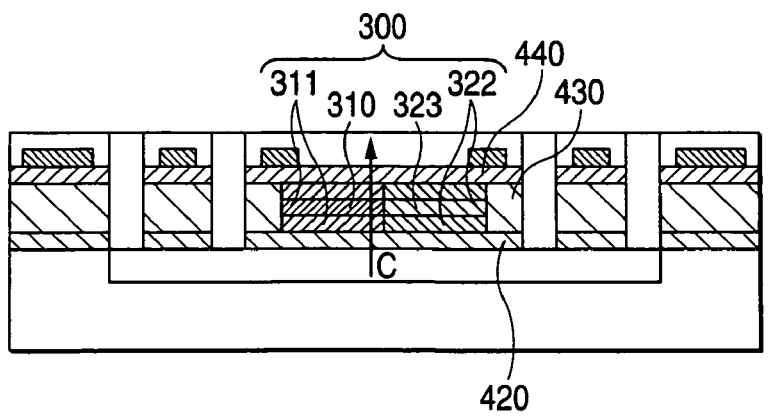
FIG. 9 is a cross-sectional view of a detector in Embodiment 2 according to the present invention.

FIG. 9 shows an insulating structure of the detector 200 and also shows a cross-section corresponding to the cross-section taken along the line A-A in FIG. 2 in Embodiment 1. In Embodiment 2, the $P^+ N^-$ junction diode is constituted with the P type semiconductor layer and the N type semiconductor layer. The P type semiconductor layer has a 3-layer structure which is divided into the $P^{++}$ type semiconductor layer 310 and the $P^+$ type semiconductor layers 311 which interpose the $P^{++}$ type semiconductor layer 310 therebetween in accordance with differences of concentrations. The N type semiconductor layer has a 3-layer structure which is divided into the $N^{--}$ type semiconductor layer 323 and the $N^-$ type semiconductor layers 322 which interpose the $N^{--}$ type semiconductor layer 323 therebetween in accordance with differences of concentrations. An upper layer and a lower layer of the semiconductor layer of the $P^+N^-$ junction diode are the insulating film 440 and the BOX layer 420, respectively. For this account, many trap levels are present at the interface of the semiconductor/oxide film.

Figure 10:
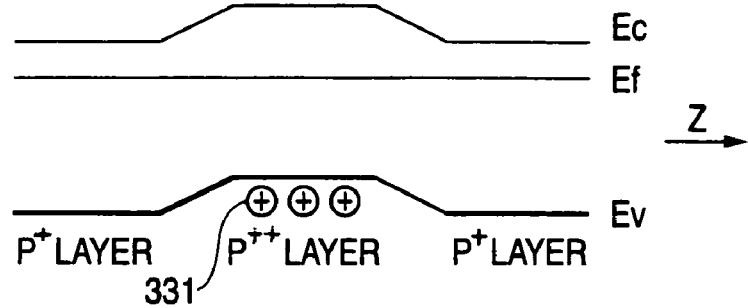
FIG. 10 is an energy level diagram of a P type semiconductor layer in Embodiment 2 according to the present invention.

FIG. 10 is a diagram showing an energy level observed from a direction along an arrow-marked C line shown in FIG. 9. In FIG. 9, since the P type semiconductor layer portion is constituted by a 3-layer constitution made up of the $P^+$ type semiconductor layer 311, the $P^{++}$ type semiconductor layer 310 and the $P^+$ type semiconductor layer 311, the energy level is set, as shown in FIG. 10, such that a conductive band and a valence band in the portion of the $P^{++}$ type semiconductor layer 310 are higher than those in the portion of the $P^+$ type semiconductor layer 311. Further, the holes 331 of the carriers gather at a place at which the potential energy is highest, namely, at an apex of the valence band, that is, not in the $P^+$ type semiconductor 311 but in the $P^{++}$ type semiconductor layer 310. In other words, the holes 331 gather none of at the interface between the SOI layer 410 and the insulating film 440, in the vicinity of the interface between the SOI layer 410 and the BOX layer 420, but in the central portion of the SOI layer. Further, the structure at the side of the N type semiconductor layer is same as that as described in Embodiment 1 using FIGS. 3 and 4

Figure 11:
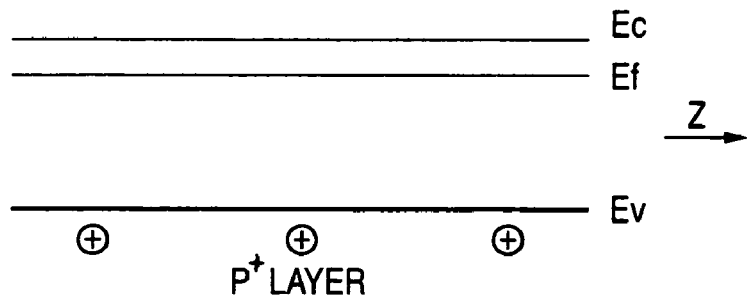
FIG. 11 is an energy level diagram in an P type semiconductor layer having a conventional structure.

FIG. 11 is an energy level diagram in the P type semiconductor layer of the PN junction diode of a conventional structure. Namely, FIG. 11 is an example of the energy level of the P type semiconductor layer observed only from the $P^+$ type semiconductor layer 311. In the conventional PN junction diode, as shown in FIG. 11, since the impurity concentration distribution of the $P^+$ type semiconductor layer 311 was uniform, the valence band was flat and the holes 331 were distributed in all areas of the $P^+$ type semiconductor layer 311. For this account, the carriers have been captured by trap levels which were present at the interface of the semiconductor/oxide film, to thereby cause the 1/f noise to be generated.

In the P− type semiconductor layer of Embodiment 2, the holes 331 of the carriers gather at a place in which a potential energy is highest, namely, at an apex of the valence band. That is, the holes 331 gather none of at the interface between the $P^+$ type semiconductor layer 311 and the insulating film 440, and in the vicinity of the interface between the $P^+$ type semiconductor layer 311 and the BOX layer 420, but in the central portion of the $P^{++}$ type semiconductor layer 310. Further, in the N type semiconductor layer, the carriers gather none of at the interface between the $N^-$ type semiconductor layer 322 and the insulating film 440, and in the vicinity of the interface between the N⁻ type semiconductor layer 322 and the BOX layer 420, but in the central portion of the N⁻⁻ type semiconductor layer 323. For this account, in the semiconductor layers of both of the P type and N type of the PN junction diode, since the carriers come to be less captured by the trap levels of the interface of the semiconductor/oxide film, the 1/f noise can be suppressed.

Figure 12A:
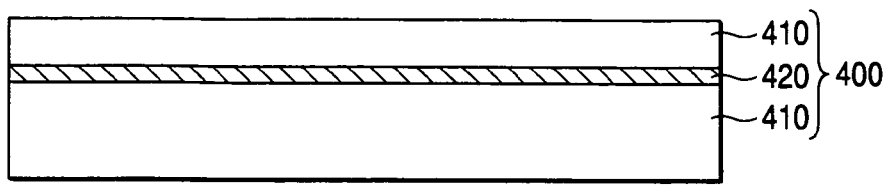
FIGS. 12A to 12E are cross-sectional diagrams showing a production method of an infrared solid-state image pickup apparatus of Embodiment 2 according to the present invention.

Next, a method for producing the infrared solid-state image pickup apparatus 100 in Embodiment 2 is described in detail. FIGS. 12 and 13 each show a cross-sectional structure of one detector 200 of the infrared solid-state image pickup apparatus 100 and show the manner in which the detector 200 is fabricated in order of production steps. In Embodiment 2, as shown in FIG. 12A, firstly, the SOI substrate 400 is used in a same manner as in Embodiment 1. A portion different from Embodiment 1 is the portion related with production steps of the PN junction diode 300 and, then, the portion will be described in detail.

Figure 12B:
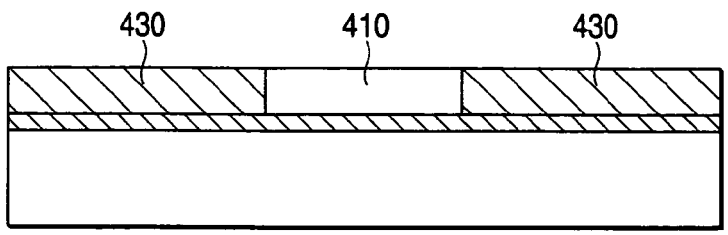
Figure 12C:
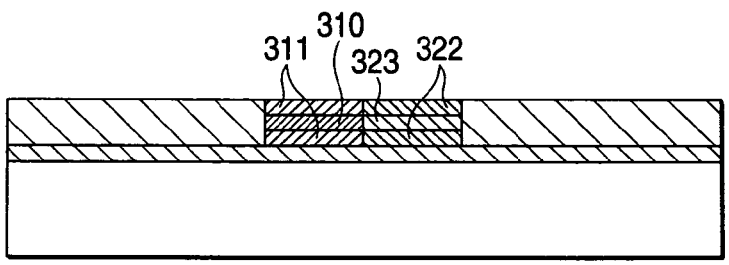
Figure 12D:
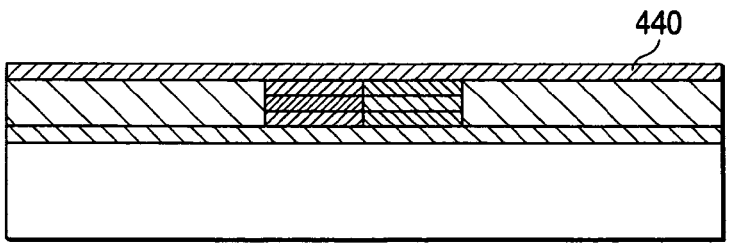
Figure 12E:
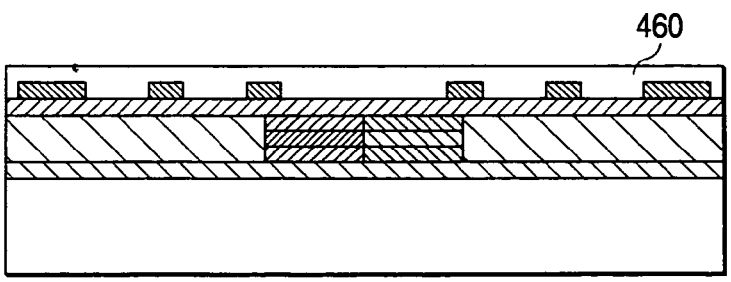
Figure 13F:
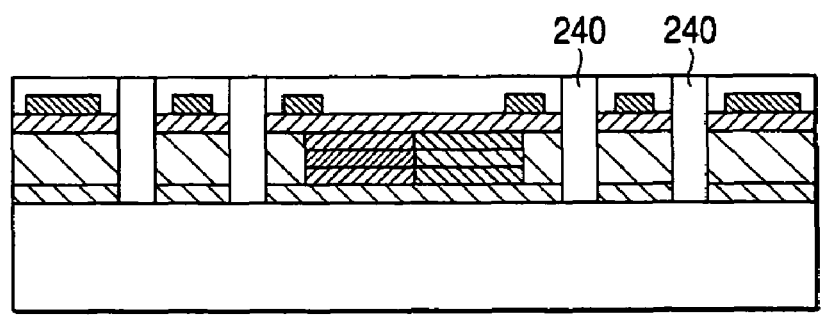
FIGS. 13F and 13G are cross-sectional diagrams showing a production method of an infrared solid-state image pickup apparatus of Embodiment 2 according to the present invention.
Figure 13G:
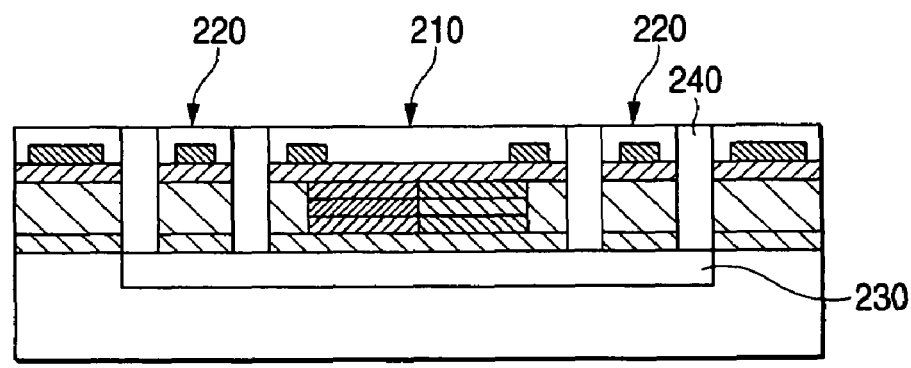

As shown in FIG. 12B, the separation oxide film 430 is formed in other portions than the PN junction diode 300 of the detector 200. Then, as shown in FIG. 12C, phosphorus and arsenic are ion-implanted in the region of the SOI layer 410 forming the N type semiconductor layer of the PN junction diode 300, to thereby form the N⁻⁻ type semiconductor layer 323 and the N⁻ type semiconductor layer 322. In a same manner as described above, boron is ion-implanted in the region of the SOI layer 410 which forms the P type semiconductor layer of the PN junction diode 300, to thereby form the P⁺⁺ type semiconductor layer 310 and the P⁺ type semiconductor layer 311. FIG. 12C shows a semiconductor layer portion of the PN junction diode 300 formed in such manner as described above. Further, in order to allow the N type and P type semiconductor layers to each have a 3-layer structure, an accelerating potential and an amount of implantation are adjusted at the time of each ion-implantation. Next, as shown in FIG. 12D, the insulating film 440 (for example, a silicon oxide layer deposited by a CVD method) is deposited thereon. Since subsequent production steps are same as in Embodiment 1, explanations of these steps are omitted. As shown in FIG. 13G, the infrared solid-state image pickup apparatus 100 provided with the detector 200 in which the detecting portion held in the air apart from the silicon substrate 140 is completed.

In the infrared solid-state image pickup apparatus according to Embodiment 2 thus described, since the carriers come to be less captured by the trap levels at the interface of the semiconductor/oxide film, the 1/f noise is suppressed and the noise of the PN junction diode 300 is reduced more than that in Embodiment 1. For this account, since the SN ratio of the output of the PN junction diode 300 is enhanced, the infrared solid-state image pickup apparatus 100 having a favorable SN ratio of the output can be provided.

In Embodiment 2 as described above, an example of the P⁺ N⁻ junction diode was shown; however, a case in which P⁺N⁻ type junction diode is replaced by P⁻ N⁺ type junction diode and, then, electrons come to be excessive minority carriers in the P type semiconductor layer may be adopted. Namely, even when the N type semiconductor layer is divided such that it comes to have a 3-layer structure made up of the N⁺ type semiconductor layer 321, the N⁺⁺ type semiconductor layer 320 and the N⁺ type semiconductor layer 321, in accordance with differences of concentrations and, also, the P type semiconductor layer is divided such that it comes to have a 3-layer structure made up of the P⁻ type semiconductor layer 312, the P⁻⁻ type semiconductor layer 313 and the P⁻ type semiconductor layer 312, in accordance with differences of concentrations, same effect as described above can be obtained.

Embodiment 3

In the PN junction diode as shown in Embodiment 1, the structure of the semiconductor layer was arranged such that the insulating film 440 and the BOX layer 420 are allowed to be an upper layer and a lower layer, respectively, of the N type semiconductor layer of the PN junction diode 300 and, then, carries are not captured by the trap levels which are present at an interface between each of these film and layer and the semiconductor/oxide film. In Embodiment 3, the structure of the semiconductor layer was arranged such that the carriers are not captured by the trap levels which are present at all the interfaces surrounding the N type semiconductor layer. That is, in addition to the structure of Embodiment 1, the structure of the semiconductor layer was arranged such that the carriers were less captured also at the interface between any one of the N type semiconductor layer and the surrounding separation film 430 and the semiconductor/oxide film. The portion in which the infrared solid-state image pickup apparatus 100 in Embodiment 3 is different from that in Embodiment 1 is only the portion which comes in contact with the N type semiconductor layer and the surrounding separation oxide film 430 in the P⁺ N⁻ junction diode of Embodiment 1 and a mechanical structure of the detector 200, the signal treatment circuit 120, movement and the like are same as in Embodiment 1. Hereinafter, the N type semiconductor layer which is a major portion of Embodiment 3 is described in detail.

Figure 14:
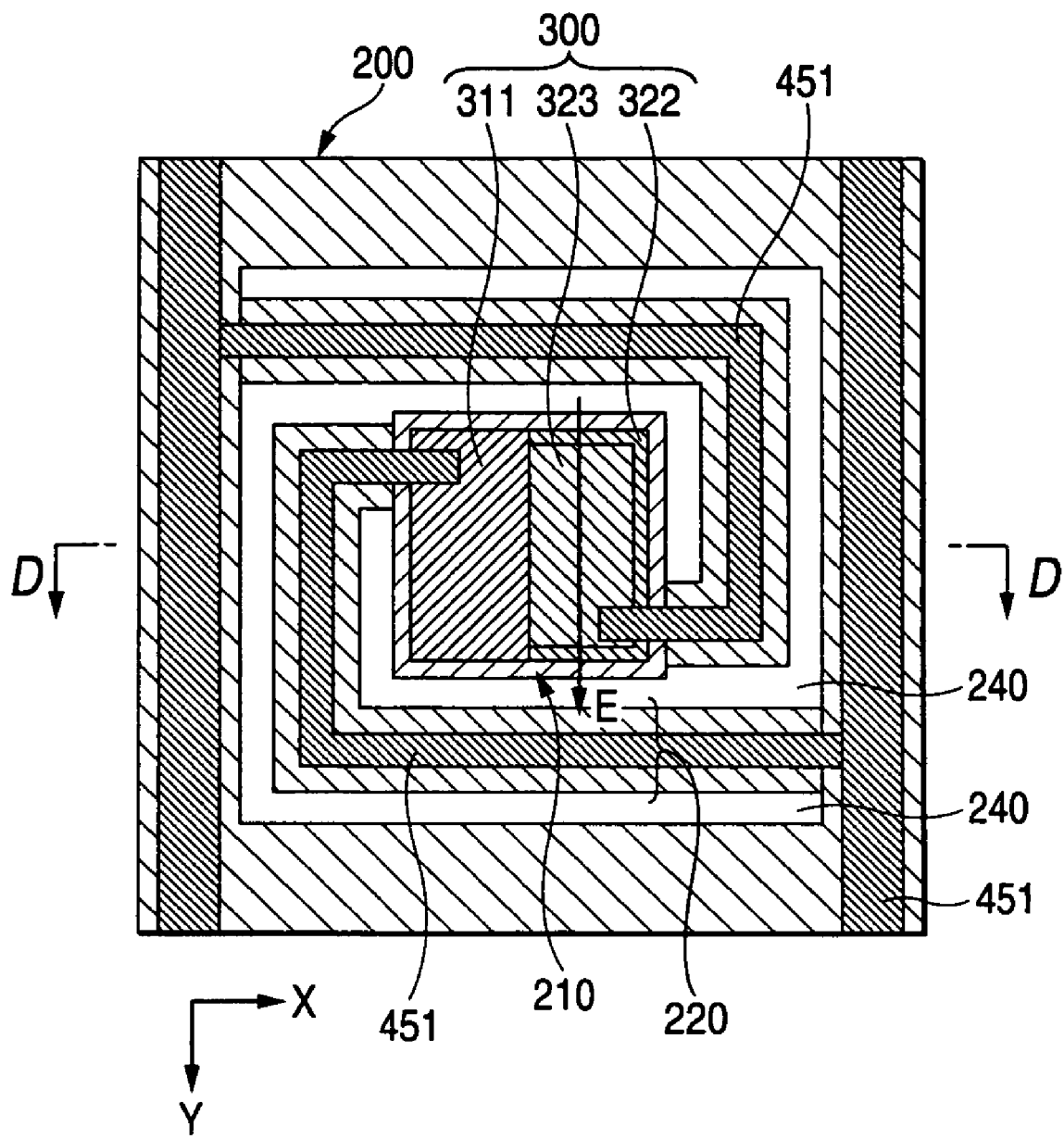
FIG. 14 is a plan view showing a detector in Embodiment 3 according to the present invention.
Figure 15:
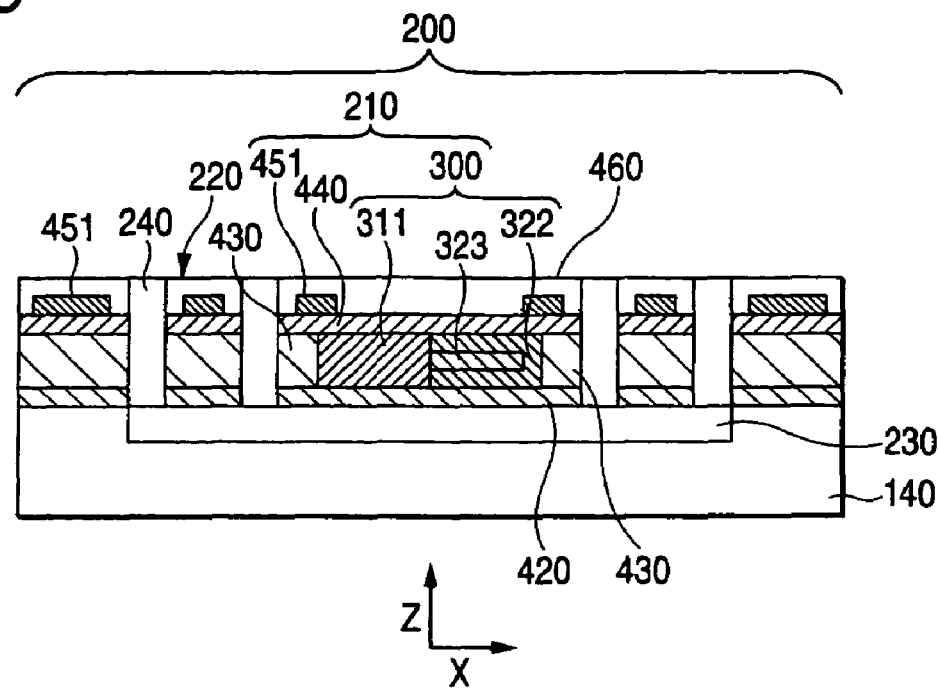
FIG. 15 is a cross-sectional view showing a detector in Embodiment 3 according to the present invention.

FIG. 14 is a partially enlarged plan view of the detector 200 provided in the infrared solid-state image pickup apparatus 100 as shown in Embodiment 3. FIG. 15 shows an insulating structure of the detector 200 and is a cross-sectional diagram taken along the D-D cross-sectional line in FIG. 14. In FIG. 15, the N type semiconductor layer is divided such that it comes to have a 3-layer structure made up of the N⁻⁻ type semiconductor layer 323 and the N⁻ type semiconductor layers 322 which interpose the N⁻⁻ type semiconductor layer 323 therebetween in accordance with differences of concentrations and, further, the periphery which comes in contact with the separation oxide film 430 is made up of the N⁻ type semiconductor layer 322. Namely, the N⁻⁻ type semiconductor layer 323 comes in contact with the surrounding oxide film via the N⁻ type semiconductor layer 322

Figure 16:
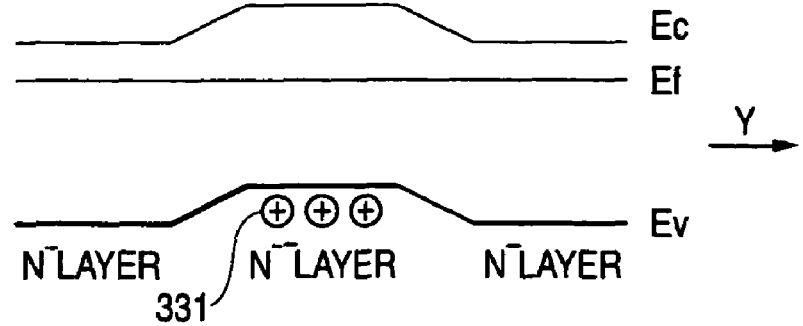
FIG. 16 is an energy level diagram of an N type semiconductor layer in Embodiment 3 according to the present invention.

FIG. 16 is an energy level diagram observed from the direction along the E line marked by an arrow in FIG. 14. In FIG. 14, since, in the N⁻⁻ type semiconductor layer 323, the periphery which comes in contact with the separation oxide film 430 is made up of the N⁻ type semiconductor layer 322, the energy levels are set such that the conductive band and the valence band of the portion of the N⁻⁻ type semiconductor layer 323 is higher than those of the N⁻ type semiconductor layer 322. For this account, the holes 331 of the carriers gather in a place in which the potential energy is highest, namely, an apex of the valence band. In other words, the holes 331 gather not in the vicinity of the interface with the separation oxide film 430 but in the central portion of the N⁻⁻ type semiconductor layer 323.

In the PN junction diode 300 as shown in Embodiment 3, the holes 331 of the carriers gather in the central portion of the N⁻⁻ type semiconductor layer 323. For this account, in the N type semiconductor layer of the PN junction diode 300, since the carriers come to be less captured by the trap levels at the interface of the semiconductor/oxide film, the 1/f noise is suppressed.

Figure 17A:
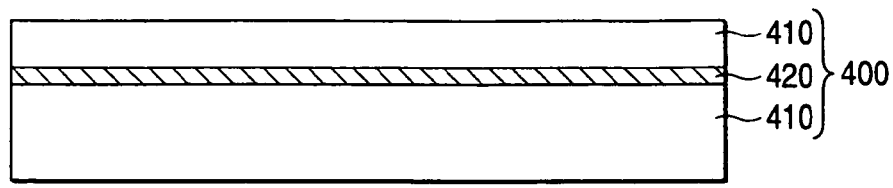
FIGS. 17A to 17E are cross-sectional diagrams showing a production method of an infrared solid-state image pickup apparatus of Embodiment 2 according to the present invention.

Next, a method for producing the infrared solid-state image pickup apparatus 100 in Embodiment 3 is described in detail. FIGS. 17 and 18 each show a cross-sectional structure of one detector 200 of the infrared solid-state image pickup apparatus 100 and show the manner in which the detector 200 is fabricated in order of production steps. In Embodiment 3, as shown in FIG. 17A, the SOI substrate 400 is used in a same manner as in Embodiment 1. A portion different from Embodiment 1 is the portion related with production steps of the PN junction diode 300 and, then, the portion will be described in detail.

Figure 17B:
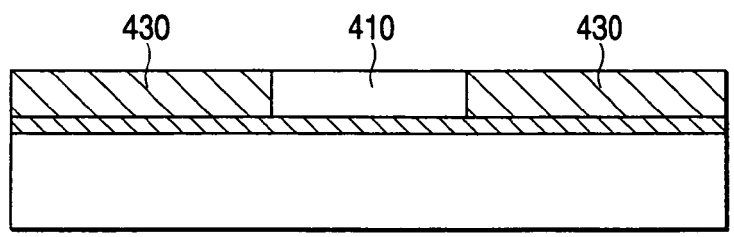
Figure 17C:
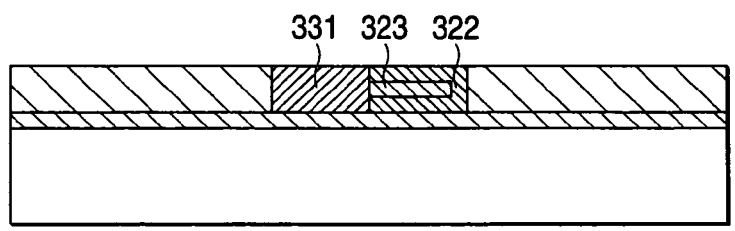
Figure 17D:
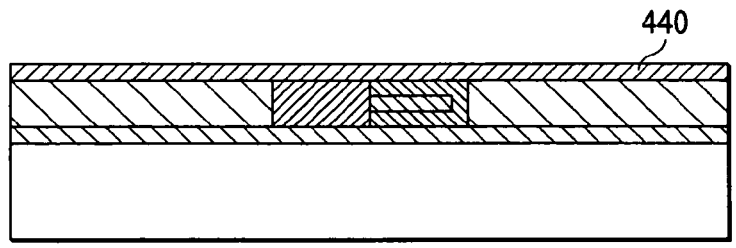
Figure 17E:
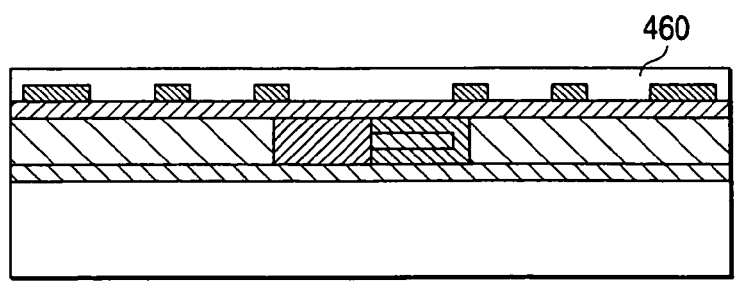
Figure 18F:
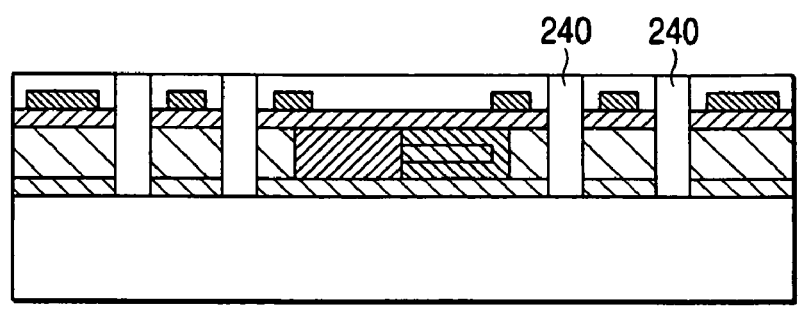
FIGS. 18F and 18G are cross-sectional diagrams showing a production method of an infrared solid-state image pickup apparatus of Embodiment 2 according to the present invention.
Figure 18G:
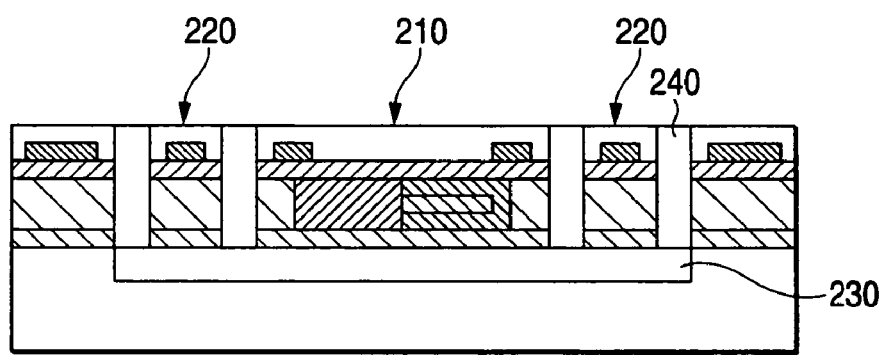

As shown in FIG. 17B, the separation oxide film 430 is formed in other portions than the PN junction diode 300 of the detector 200. Then, as shown in FIG. 17C, phosphorus and arsenic is ion-implanted in the region of the SOI layer 410 forming the N type semiconductor layer of the PN junction diode 300, to thereby form the $N^{--}$ type semiconductor layer 323 and the $N^-$ type semiconductor layer 322. On this occasion, phosphorus and arsenic are ion-implanted also in the vicinity of the interface between the $N^{--}$ type semiconductor layer 323 and the separation oxide film 430, to thereby form the $N^-$ type semiconductor layer 322. The step of this portion is different from that in Embodiment 1 and, by using a resist pattern which has an opening in the vicinity of the interface between the $N^{--}$ type semiconductor layer 323 and the separation oxide film 430, a selective implantation is performed, to thereby form the $N^-$ type semiconductor layer 322 in a desired shape. Next, boron is ion-implanted in the region of the SOI layer 410 which forms the P type semiconductor layer of the PN junction diode 300, to thereby form the $P^+$ type semiconductor layer 311. FIG. 17C shows a semiconductor layer portion of the PN junction diode 300 formed in such manner as described above. Next, as shown in FIG. 17D, the insulating film 440 (for example, a silicon oxide layer deposited by a CVD method) is deposited thereon. Since subsequent production steps are same as in Embodiment 1, explanations of these steps are omitted.

As described above, in Embodiment 3, in the semiconductor layer of the PN junction diode 300, since, in the $N^{--}$ type semiconductor 323, all the peripheries which come in contact with the separation oxide film 430 are made up of the $N^-$ type semiconductor layer 322 the carriers come to be less captured by the trap levels at the interface of the semiconductor/oxide film, the 1/f noise is suppressed. For this account, the noise of the PN junction diode 300 is reduced more than that in Embodiment 1 and, then, since the SN ratio of the output of the PN junction diode 300 is enhanced, the infrared solid-state image pickup apparatus 100 having a favorable SN ratio of the output can be provided.

In Embodiment 3, an example of the $P^+ N^-$ junction diode was shown; however, a case in which $P^+ N^-$ type junction diode is replaced by $P^- N^+$ type junction diode and, then, electrons come to be excessive minority carriers in the P type semiconductor layer may be adopted. Namely, even when the N type semiconductor layer is set to be the $N^+$ type semiconductor layer 321 of high concentration while the P type semiconductor layer is divided into the $P^-$ type semiconductor layer 312 and the $P^{--}$ type semiconductor layer 313 in accordance with differences of concentrations, the same effect as described above can be obtained.

Figure 19:
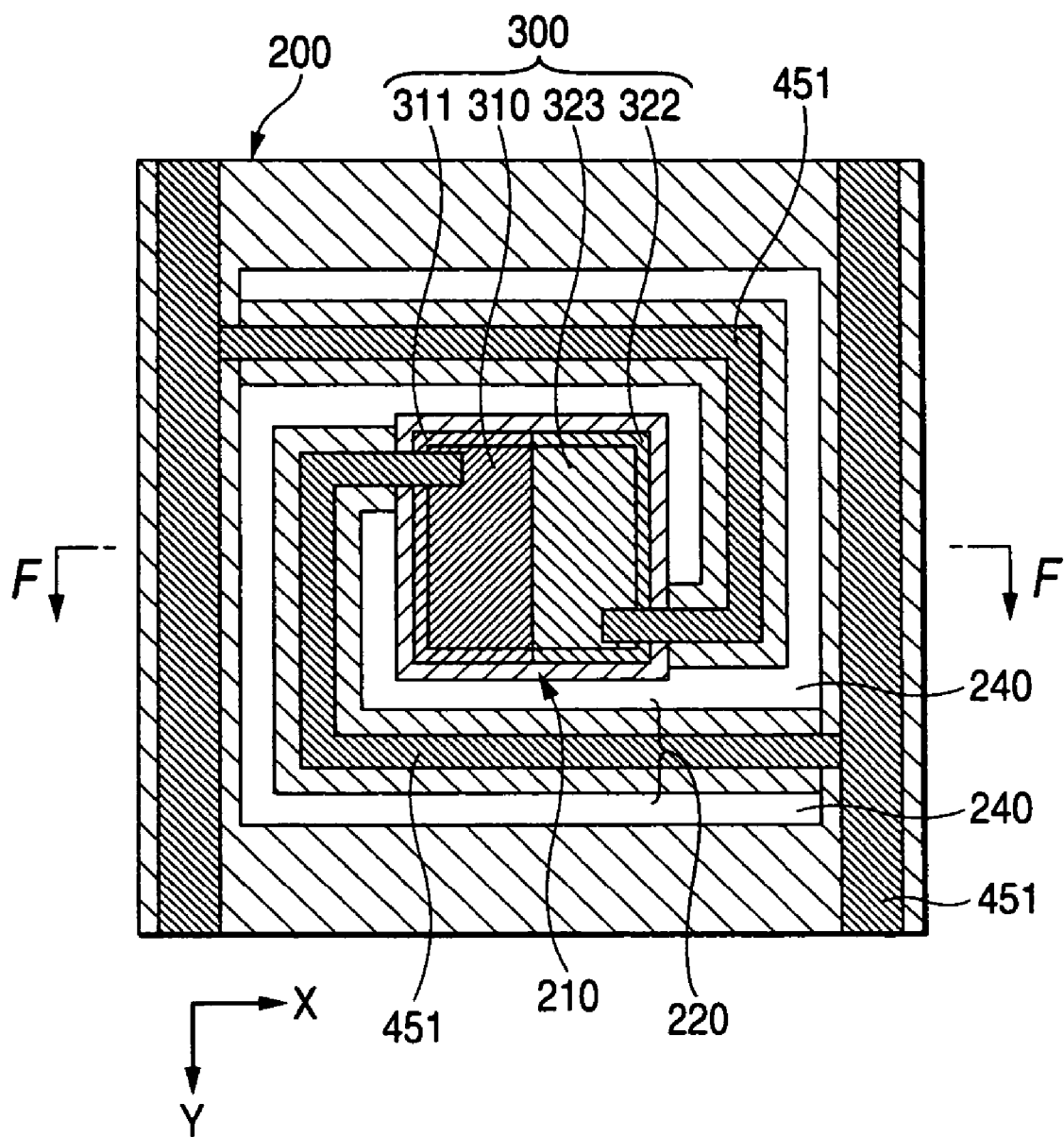
FIG. 19 is a plan view showing a detector in Embodiment 3 according to the present invention.
Figure 20:
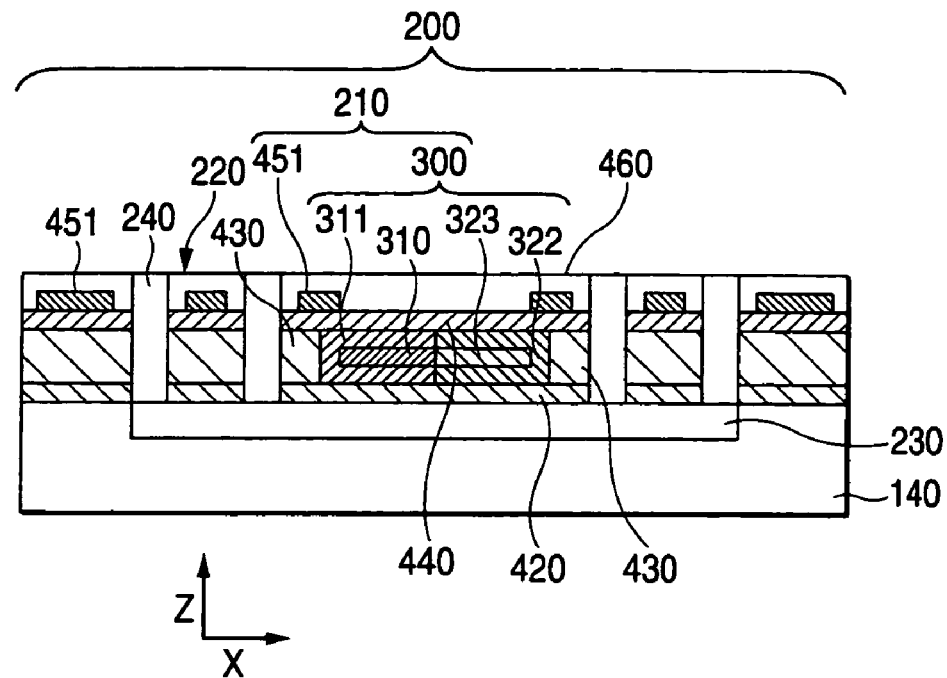
FIG. 20 is a cross-sectional view showing a detector in Embodiment 3 according to the present invention.

Further, in Embodiment 3, the N type semiconductor layer was arranged such that it came to obtain the noise reduction effect. Nevertheless, the P type semiconductor layer can also be arranged such that it comes to obtain the noise reduction effect. Namely, the P type semiconductor layer may be divided into the $P^{++}$ type semiconductor layer 310 and the $P^+$ type semiconductor layer 311 in accordance with differences of concentrations and, then, the N type semiconductor layer may be divided into the $N^-$ type semiconductor layer 322 and the $N^{--}$ type semiconductor layer 323 in accordance with differences of concentrations. FIG. 19 is a plan view of the detector 200 of this example. FIG. 20 is a cross-sectional diagram taken along the F-F cross-sectional line in FIG. 19. By the PN junction diode 300 as shown in FIG. 20, in both of the P type semiconductor layer and the N type semiconductor layer, the holes 331 gather none of at the interface between the P type or N type semiconductor layer and the separation oxide film 430, at the interface between the P type or N type semiconductor layer and the insulating film 440, and in the vicinity of the interface between the P type or N type semiconductor layer and the BOX layer 420, but in the central portion of the P type or N type semiconductor layer. For this account, the noise of the PN junction diode 300 is reduced more than the former cases and, since the SN ratio of the output of the PN junction diode 300 is enhanced, the infrared solid-state image pickup apparatus 100 having a favorable SN ratio can be provided.

The PN junction diode 300 described above was an example of the $P^+ N^-$ junction diode; however, a case in which $P^+ N^-$ type junction diode is replaced by $P^- N^+$ type junction diode, the same noise reduction effect can be obtained. Namely, even when the N type semiconductor layer is divided into the $N^{++}$ type semiconductor layer 320 and the $N^+$ type semiconductor layer 321 in accordance with differences of concentrations, while the P type semiconductor layer is divided into the $P^-$ type semiconductor layer 312 and the $P^{--}$ type semiconductor layer 313, the infrared solid-state image pickup apparatus 100 having a favorable SN ratio of the output can similarly be obtained.

Embodiment 4

In Embodiment 1, the N type semiconductor layer of the PN junction diode 300 was allowed to be the structure of the semiconductor layer such that the carries were not captured by the trap levels which were present at the interface of the semiconductor/oxide film. In Embodiment 4, a mode in which the $N^{--}$ type semiconductor layer 323 which constitutes the $P^+ N^-$ junction diode has further been improved is described in detail. The portion in which the infrared solid-state image pickup apparatus 100 in Embodiment 4 is different from that in Embodiment 1 is only the N type semiconductor layer of the $P^+ N^-$ junction diode in Embodiment 1 and a mechanical structure of the detector 200, the signal treatment circuit 120, movement and the like are same as in Embodiment 1. Hereinafter, the N type semiconductor layer which is a major portion of Embodiment 4 is described in detail.

Figure 21:
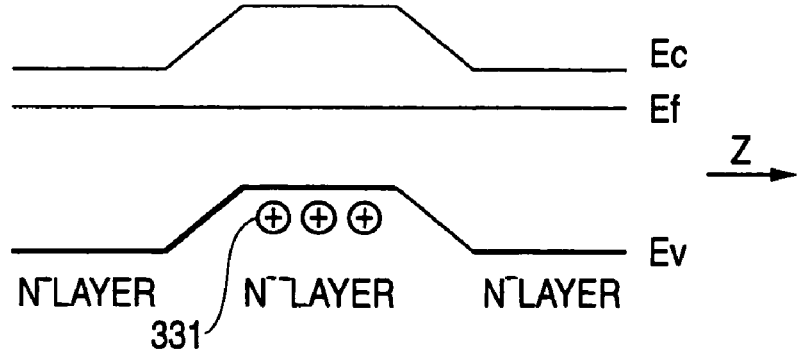
FIG. 21 is an energy level diagram of an N type semiconductor layer in Embodiment 4 according to the present invention.

As an initial state, energy levels of the $N^-$ type semiconductor layer 323 which constitutes the $P^+ N^-$ junction diode in Embodiment as shown in FIG. 3 are allowed to be a state as shown in FIG. 4. On this occasion, an effect to be obtained by implanting boron which is a P type impurity having a polarity opposite to phosphorus and arsenic which are the N type impurities into the N type semiconductor layer is examined. In FIG. 3, when boron is implanted in the vicinity of the $N^{--}$ type semiconductor layer 323, the energy level diagram in FIG. 4 is changed into that as shown in FIG. 21. In FIG. 21, a passage of the hole 331 which is a portion in which the potential energy in the vicinity of the center is in a convex state is expanded and also deepened. This is because a charge of the P type impurity cancels a charge of the N type impurity. Namely, in Embodiment 4, boron which is the P type impurity is implanted in the N type semiconductor layer, to thereby expand and, also deepen the passage of the holes 331.

The state of the energy levels shown in FIG. 21 according to Embodiment 4 can be realized by adjusting an impurity profile of phosphorus and arsenic even when boron is not used. However, in an ion implantation method, since boron can easily have a larger implantation range compared with phosphorus and arsenic, the method exhibited in Embodiment 4 is capable of reducing the production cost compared with that in Embodiment 1.

Figure 22:
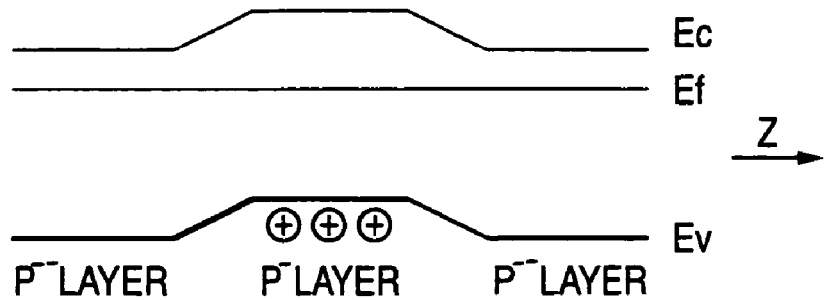
FIG. 22 is an energy level diagram of a cross-section of a P type semiconductor layer in Embodiment 4 according to the present invention.
Figure 23:
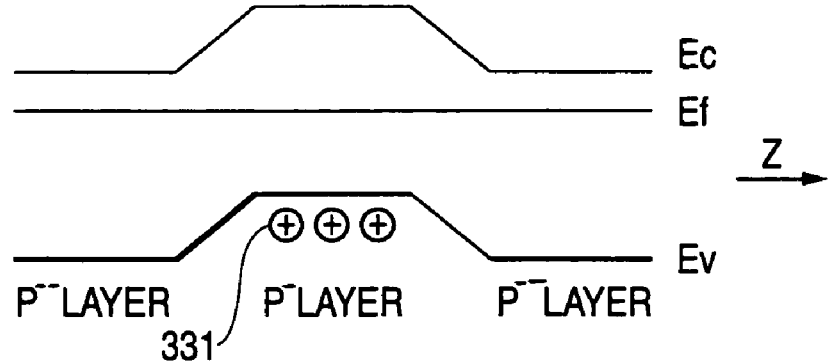
FIG. 23 is an energy level diagram of a cross-section of a P type semiconductor layer in Embodiment 4 according to the present invention.

In Embodiment 4 as described above, an example of the $P^+$ $N^-$ junction diode has been described in detail; however, even when this is arranged such that the N type semiconductor layer is changed into the $N^+$ type of high concentration while the P type semiconductor layer is divided into the $P^-$ type semiconductor layer 312 and the $P^{--}$ type semiconductor layer 313, the same effect can be obtained. Namely, the PN junction diode 300 on this occasion is the $P^-$ $N^+$ junction diode and, then, in the P type semiconductor layer, it is allowed to set electrons to be excessive minor carriers. In this case, boron is implanted in the SOI layer 410, to thereby form, first of all, the $P^-$ type semiconductor layer 312 and the $P^{--}$ type semiconductor layer 313. Further, by implanting phosphorus and arsenic in the SOI layer 410, to thereby temporarily form the $N^+$ type semiconductor layer 321. The energy levels at this stage are as shown in FIG. 22. On this occasion, an effect to be obtained by implanting boron which is a P type impurity having a polarity opposite to phosphorus and arsenic which are the N type impurities into the P type semiconductor layer is examined. When phosphorus is implanted in the vicinity of the $P^{--}$ type semiconductor layer 313 shown in FIG. 20, the energy level diagram shown in FIG. 22 is changed into that as shown in FIG. 23. In FIG. 23, a passage of the electrons which is a portion in which the potential energy in the vicinity of the center is in a convex state is expanded and also deepened. This is because a charge of the N type impurity cancels a charge of the P type impurity. Namely, in the present embodiment, phosphorus which is the N type impurity is implanted in the P type semiconductor layer, to thereby expand and, also, deepen the passage of the holes 331. On this occasion, in a same way as described above, it is possible to easily generate a convex state of the potential energy by the ion implantation method.

What is claimed is:

1. An infrared solid-state image pickup apparatus, comprising:
   an SOI substrate having a silicon oxide film layer and an SOI layer on a silicon substrate;
   a detecting portion, which is provided with a PN junction diode formed on the SOI substrate, and converts a temperature change generated by an incident infrared ray to an electric signal; and
   a support that holds the detecting portion with a space from the silicon substrate of the SOI substrate, wherein
   a semiconductor layer constituting the PN junction diode has a first doped side and a second doped side doped oppositely to the first doped side, the second doped side having a layered structure, as viewed from a cross section perpendicular to a current flowing direction of the PN junction diode, and
   an impurity is distributed in the semiconductor layer such that major carriers or excessive minority carriers flowing in the semiconductor layer flow more in a central layer of the second doped side of the semiconductor layer than in a peripheral layer thereof as viewed from said cross section perpendicular to said current flowing direction.

2. The infrared solid-state image pickup apparatus according to claim 1, wherein the PN junction diode is constituted by a P+ type semiconductor layer and an N− type semiconductor layer,
   an insulating film is formed on the SOI layer, and
   a separation oxide film is formed around the PN junction diode, having any one or both of the following cases: a concentration of an N type impurity in the N− type semiconductor layer is higher in vicinities of an interface between the N− type semiconductor layer and the silicon oxide film layer and an interface between the N− type semiconductor layer and the insulating film than in a central portion of the N− type semiconductor layer; and
   the concentration of the N type impurity in the N− type semiconductor layer is higher in a vicinity of an interface between the N− type semiconductor layer and the separation oxide film layer than in the central portion of the N− type semiconductor layer.

3. The infrared solid-state image pickup apparatus according to claim 1, wherein the PN junction diode is constituted by a P+type semiconductor layer and an N− type semiconductor layer,
   an insulating film is formed on the SOI layer, and
   a separation oxide film is formed around the PN junction diode, having any one or both of the following cases: a concentration of a P type impurity in the P+ type semiconductor layer is lower in vicinities of an interface between the P+ type semiconductor layer and the silicon oxide film layer and an interface between the P+ type semiconductor layer and the insulating film than in a central portion of the P+ type semiconductor layer; and
   the concentration of the P type impurity in the P+ type semiconductor layer is lower in a vicinity of an interface between the P+ type semiconductor layer and the separation oxide film layer than in the central portion of the P+ type semiconductor layer.

4. The infrared solid-state image pickup apparatus according to claim 1, wherein the PN junction diode is constituted by a P− type semiconductor layer and an N+ type semiconductor layer,
   an insulating film is formed on the SOI layer, and
   a separation oxide film is formed around the PN junction diode, having any one or both of the following cases: a concentration of an N type impurity in the N+ type semiconductor layer is lower in vicinities of an interface between the N+ type semiconductor layer and the silicon oxide film layer and an interface between the N+ type semiconductor layer and the insulating film than in a central portion of the N+ type semiconductor layer; and
   the concentration of the N type impurity in the N+ type semiconductor layer is lower in a vicinity of an interface between the N+ type semiconductor layer and the separation oxide film layer than in the central portion of the N+ type semiconductor layer.

5. The infrared solid-state image pickup apparatus according to claim 1, wherein the PN junction diode is constituted by a P− type semiconductor layer and an N+ type semiconductor layer,
   an insulating film is formed on the SOI layer, and
   a separation oxide film is formed around the PN junction diode, having any one or both of the following cases: a concentration of a P type impurity in the P− type semiconductor layer is higher in vicinities of an interface between the P− type semiconductor layer and the silicon oxide film layer and an interface between the P− type semiconductor layer and the insulating film than in a central portion of the P− type semiconductor layer; and the concentration of the P type impurity in the P− type semiconductor layer is higher in a vicinity of an interface between the P− type semiconductor layer and the separation oxide film layer than in the central portion of the P− type semiconductor layer.

6. The infrared solid-state image pickup apparatus according to claim 2, wherein an N−− type semiconductor layer including a P type impurity is present in the central portion of the N− type semiconductor layer.

7. The infrared solid-state image pickup apparatus according to claim 3, wherein an N−− type semiconductor layer including a P type impurity is present in the central portion of the N− type semiconductor layer.

8. The infrared solid-state image pickup apparatus according to claim 4, wherein a P−− type semiconductor layer including an N type impurity is present in at least one vicinity of an interface among vicinities of an interface between the P− type semiconductor layer and the silicon oxide film layer, an interface between the P− type semiconductor layer and the insulating layer, and an interface between the P− type semiconductor layer and the separation oxide layer.

9. The infrared solid-state image pickup apparatus according to claim 5, wherein a P−− type semiconductor layer including an N type impurity is present in at least one vicinity of an interface among vicinities of an interface between the P− type semiconductor layer and the silicon oxide film layer, an interface between the P− type semiconductor layer and the insulating layer, and an interface between the P− type semiconductor layer and the separation oxide layer.

* * * * *